United States Patent [19]
Wada

[11] Patent Number: 5,227,754
[45] Date of Patent: Jul. 13, 1993

[54] MAGNETIC FLUX TRANSMISSION SYSTEM
[75] Inventor: Ichiro Wada, Kanagawa, Japan
[73] Assignee: Kabushiki Kaisha Toshiba, Kanagawa, Japan
[21] Appl. No.: 337,720
[22] Filed: Apr. 13, 1989
[30] Foreign Application Priority Data Apr. 14, 1988 [JP] Japan .................................. 63-92038

[51] Int. Cl.⁵ ............................................. H01F 1/00
[52] U.S. Cl. ..................................... 335/216; 335/301
[58] Field of Search ............... 335/216, 301, 302, 296; 505/1, 879

[56] References Cited
U.S. PATENT DOCUMENTS

| | | | |
|---|---|---|---|
| 3,098,181 | 7/1963 | Cioffi | 335/216 |
| 3,102,973 | 9/1963 | Kunzler | 335/216 |
| 3,278,808 | 10/1966 | Borfeld | 335/216 |
| 4,797,386 | 1/1989 | Gyorgy | 335/216 |

OTHER PUBLICATIONS

Murakami et al., "Preparation and Properties of Superconducting Oxide Single Crystalline Thin Films," Appl. Phys. Lett. 57 (No. 2) pp. 227-231, 1988.

*Primary Examiner*—Leo P. Picard
*Assistant Examiner*—Trinidad Korka
*Attorney, Agent, or Firm*—Finnegan, Henderson, Farabow, Garrett & Dunner

[57] ABSTRACT

A system for transmitting magnetic flux distance from a flux generating device uses a flux transmission unit for transmitting the flux that has a special portion made of superconductive material. Several embodiments disclose different flux transmission path construction and the control of the transmission of data by controlling the superconductive properties and the generation of the flux.

22 Claims, 7 Drawing Sheets

Fig.11  Fig.12 NON-SUPER CONDUCTING PART  Fig.13 SUPER CONDUCTOR

BAND-SHAPED
LAMINATED CORE

Fig.18a

MULTI-CORED
WIRE CORE

Fig.18b

SOLENOID
CORE

Fig.18c

SINGLE-CORED
WIRE CORE

MAGNETIC FLUX TRANSMISSION SYSTEM

BACKGROUND OF THE INVENTION

This invention relates to a magnetic system, and more particularly to a magnetic flux transmission system.

Conventionally, various types of electrical devices have been developed using magnets, transformers or choke coils etc., as devices for efficiently utilizing the magnetic flux generated thereby. For example, in transmitting magnetic flux to a fairly distant location, it is necessary to use a solenoid having a length about the same as the transmission distance. If the coil length is very great, this is uneconomic, and lacking in practicality.

Figure 1:
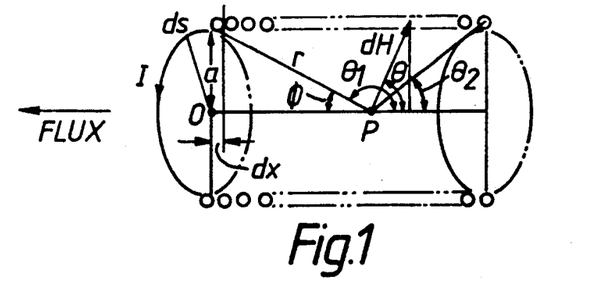
FIG. 1 is a diagrammatic representation of the principles involved in the transmission of magnetic flux.

The basic reasons for this will be explained below by a calculation concerning the reasons why magnetic flux cannot be transmitted over long distances. Referring to FIG. 1, when a current I flows in a circular circuit consisting of a coil of one turn at the leftmost end, the direction of the magnetic flux at the center point 0 is then the direction perpendicular to the plane of the circular circuit. In a vacuum, magnetic field dH of point 0 obtained from linear element ds of prescribed length can be found by the Biot-Savart Law by:

$$dH = [I/(4\pi a^2)]ds \qquad (1)$$

Consequently, the magnetic field H obtained from the complete circuit is:

$$H = \int dH = \int [I/(4\pi a^2)]ds = I/2a \qquad (2)$$

where $ds = 2\pi a$. The above equation (2) gives the field obtained for one turn at the left most end in FIG. 1. However, clearly, in the case of n turns, $$H = nI/2a \qquad (3)$$

The intensity of the magnetic field at a point P on the axis of the circular circuit is next determined. The magnetic field dH at point P obtained from linear element ds is perpendicular to ds and distance r, so, based on the object concept, the effective amount of the entire magnetic field is the component in the OP direction.

The component of dH in the OP direction =

$[(Ids)/(4\pi r^2)] \sin \phi$, so:

$$H = [(Ids)/4\pi r^2)] \sin \phi \qquad (4)$$
$$= [(aI)/(2r^2)] \sin \phi$$
$$a^2 I/2r^3$$

If it is assumed that OP = x, $$H(x) = Ia^2/[2(A^2+x^2)^{3/2}] \qquad (5)$$

is obtained. If it is provisionally assumed that there are n circular circuit turns, then $$H = nIa^2/[2(a^2+X^2)^{3/2}] \qquad (6)$$

Consequently, the intensity of the magnetic field at a point other than on the axis cannot easily be found. However, the approximate magnitude of the magnetic field can be inferred from FIG. 2, as will be explained.

Figure 2:
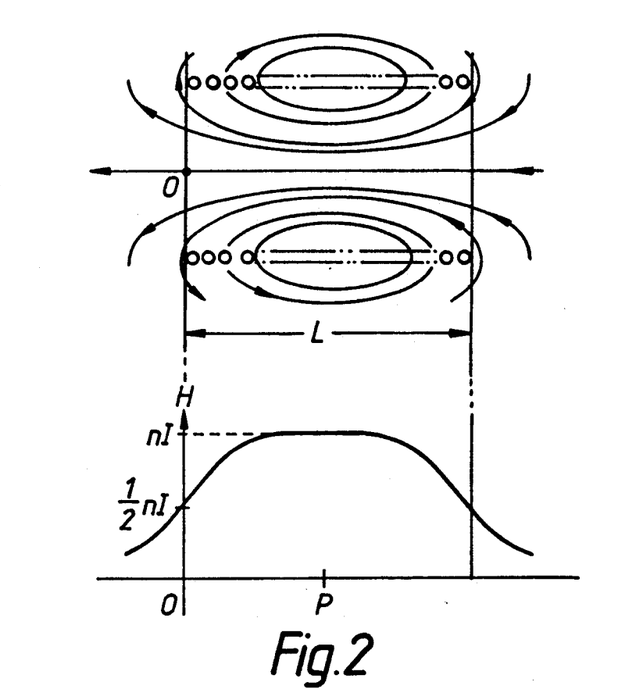
FIG. 2 is a diagrammatic representation of a magnetic field created by solenoid.

An example of a magnetic field created by a single-layer winding solenoid shall be used, for simplicity in calculation. If it is assumed that the number of turns per unit length of the solenoid is n, its radius is a, and that it is wound with uniform thickness on a cylinder, the intensity of the magnetic field at a point P on its center axis is:

$$dH = (nIa^2\,dx)/[2(a^2+x2)^{3/2}] \qquad (7)$$

where $x = a \cot\Theta$, $dH = -(\frac{1}{2}) nI \sin\Theta d\Theta$, so:

$$H = -\int_{\Theta_1}^{\Theta_2} \frac{1}{2} - nI \sin\Theta d\Theta = \frac{1}{2} nI (\cos\Theta_2 - \cos\Theta_1) \qquad (8)$$

Consequently, if point P is in the neighborhood of the middle of a solenoid of sufficient length, $\cos\Theta_1 = 0$, $\cos\Theta_2$ approximately equals + 1, so, from above equation (8), $$H = nI \qquad (9)$$

and, at point 0 at the end of the solenoid, $\cos\Theta_1 = 0$, $\cos\Theta_2$ approximately equals + 1, so, from equation (8): and, at end 0 of the solenoid, $$H = (\frac{1}{2}) nI \qquad (10)$$

Figure 3:
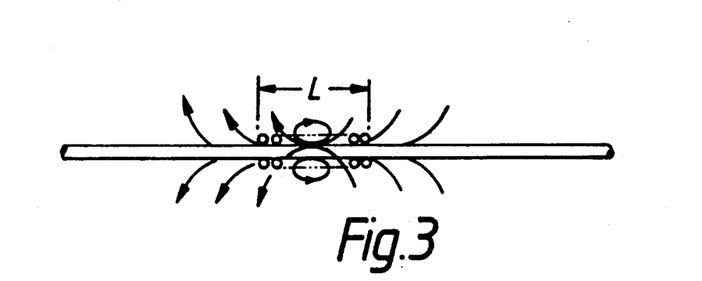
FIG. 3 is a diagram illustrating magnetic flux leakage.

As shown in FIG. 2, there is a rapid reduction in the intensity of the magnetic field at the end of the solenoid. As is apparent from equation (9) and equation (10), it is one half that at the center. This fact means that, with a conventional magnetic flux generating device using an iron core, or in the case of an air-cored coil described above, at a distance beyond length L of the windings, the magnetic flux leaks to the outside. As shown in FIG. 3, this causes an abrupt decrease in the magnetic field, which makes transmission of magnetic flux over a long distance impossible.

SUMMARY OF THE INVENTION

It is an object of this invention to provide an efficient long-distance transmission of magnetic flux.

Another object of the invention is to provide for the transmission of information using magnetic flux as the medium.

The foregoing objects are achieved according to the present invention by providing a system for transmitting magnetic flux comprising a magnetic flux generator having a first predetermined axial length for generating a magnetic field, and an elongated transmitting means mounted to and coaxially disposed relative the flux generator, the elongated means having at least a portion thereof made of superconducting material and having a second predetermined length substantially greater than the first predetermined length for transmitting the generated magnetic field the second predetermined length.

In another aspect, a method of transmitting magnetic flux a substantial distance from a first to a second predetermined location, comprises positioning at the first predetermined location a magnetic flux generator having opposite polarities disposed on a central axis; and coaxially mounting an elongated member comprised of superconducting material relative the magnetic flux generator, at least one end of the elongated member extends axially a spaced distance from the magnetic flux generator at least corresponding to the second predetermined location.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

A more complete appreciation of the present invention and many of its attendant advantages will be readily obtained by reference to the following detailed description considered in connection with the accompanying drawings, in which.

DESCRIPTION OF THE PREFERRED EMBODIMENTS

Figure 4:
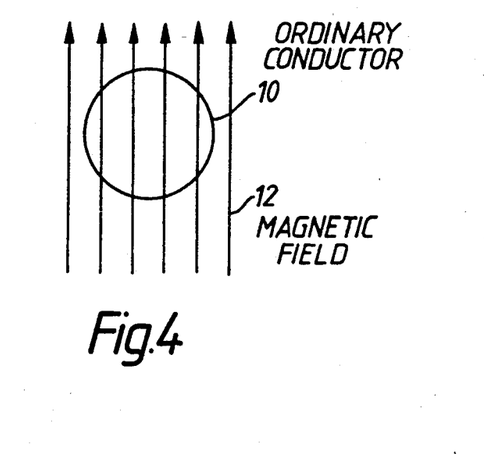
FIG. 4 is a diagram illustrating the magnetic characteristics of a conventional conductor.
Figure 5:
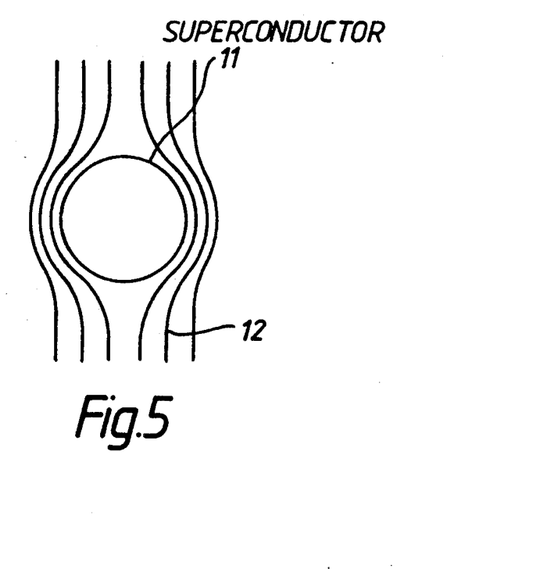
FIG. 5 is a diagram illustrating the characteristics of a magnetic field in a superconductor.

Before explaining the several embodiments of a system according to this invention, a brief explanation will be given of the principles whereby a superconducting material can transmit magnetic flux without leakage to the outside. In general, and as shown in FIG. 4 a magnetic field goes straight through the interior of a spherical ordinary conductor 10. However, if, instead of ordinary conductor 10, a spherical superconductor 11 is used, for example, as shown in FIG. 5, a magnetic field in the opposite direction is created at the surface, without magnetic field 12 passing through the interior of superconductor 11. Thus, the superconductor has what is known as the property of rejecting ingress of magnetic fields from the outside. That is, if a conventional or ordinary conductor 10, such as metal, is placed in a magnetic field, the electrons are subjected to a Lorentz force, while performing circular motion, and create a diamagnetic current in ordinary conductor 10. However, in a superconductor 11, this diamagnetic current is extremely large, with the result that the magnetic field created by this current cancels the magnetic field from the outside. Furthermore, superconductor 11 has no electrical resistance even if a current flows in it, so a magnetic field cannot exist in its interior.

Figure 6:
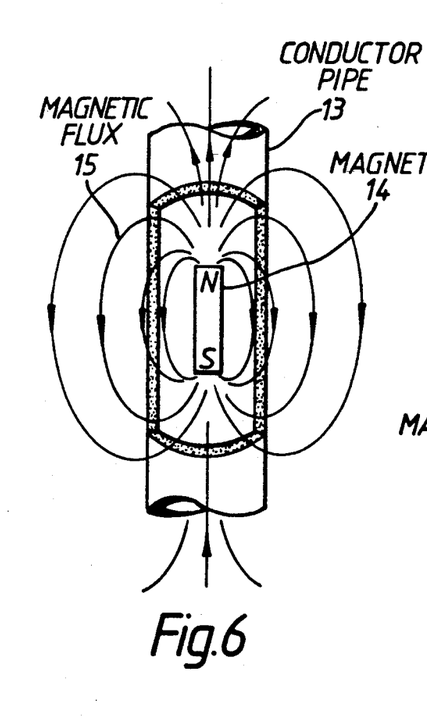
FIG. 6 is a diagram illustrates the characteristics of a magnetic field generated by a magnet disposed within a conventional tubular conductor.
Figure 7:
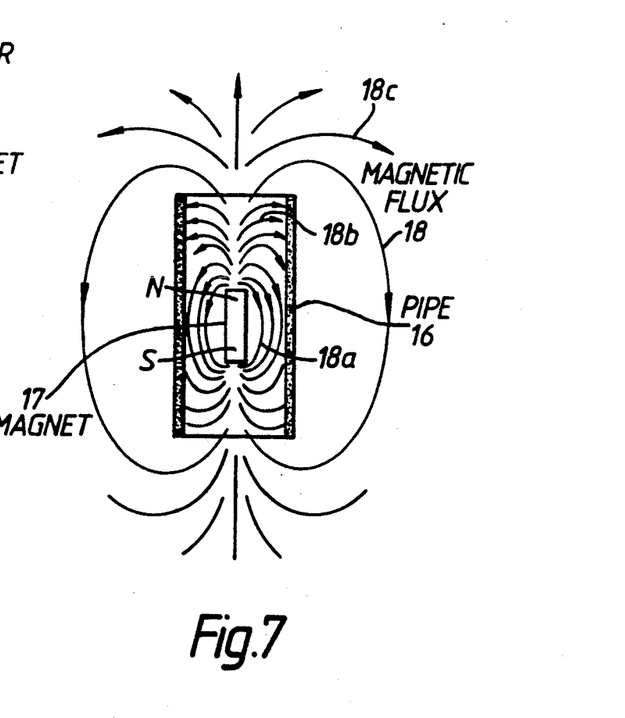
FIG. 7 is a diagram illustrating the characteristics of a magnetic field generated by a magnet disposed within a tubular conductor of superconductive material.

Accordingly, as shown in FIG. 6 and FIG. 7, a magnetic flux path is obtained when the properties of such a superconductor are effectively utilized by employing a tubular shape instead of the spherical body, and a magnet or coil is disposed in the interior tube. Specifically, in FIG. 6, when a magnet or coil 14 is disposed in the interior of an ordinary conductive tube 13, a closed magnetic path is formed whereby the magnetic flux 15 generated from, for example, the N pole of this magnet passes through the outside of pipe 13 instead of within superconductor pipe 16, and practically all this flux enters the S pole. As a result, magnetic flux 15 cannot be transmitted to a remote location.

In contrast, when a magnet or coil 17 is disposed within a superconducting tube or pipe 16, as shown in FIG. 7, a part 18a of the magnetic flux 18 issuing from N pole of this magnet 17 passes through the bore in pipe 16, while the other part 18b stays within the inside wall of pipe 16, and the rest of the remaining flux 18c flies out into space through one end of pipe 16, returning from the other end of the pipe, to enter the S pole of magnet 17. Consequently, of the above various parts of the magnetic flux, if the external diameter of magnet 17 is practically the same as the internal diameter of pipe 16, and is being arranged such that no gap is produced, this magnetic path of flux 18a can be eliminated. Also, if pipe 16 is made long, magnetic flux 18c can be greatly reduced, and, as a result, practically all of the magnetic flux generated from the N pole can be collected in the inside wall of pipe 16.

Figure 8:
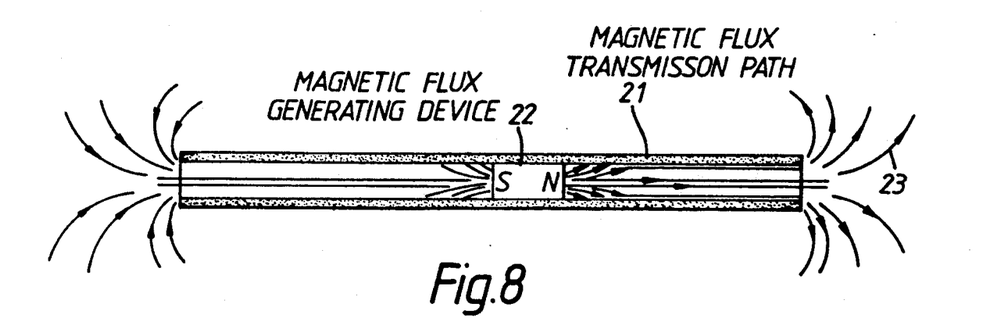
FIG. 8 is a sectional view of a magnetic flux transmission system in accordance with a first embodiment of the present invention.

FIG. 8 is a view showing a first embodiment of the device of this invention. There is provided a superconducting magnetic flux transmission path 21 having an arbitrarily fixed prescribed length and constructed of a superconducting material. At a prescribed part, arbitrarily fixed, inside this magnetic flux transmission path 21, there is arranged a magnetic flux generating device 22, which may be, for example, a d.c. magnetized magnet, an a.c. magnetized magnet, or a.c. magnetizing coil etc., having an external diameter practically equal to the internal diameter of this magnetic flux transmission path 21. Superconducting magnetic flux transmission path 21, may be for example, of type 1 superconducting materials (Al, Na, Pb, Sn, etc). However, in fact, type 1 are extremely pure metals, which do not permit escape of magnetic flux 23, and are therefore preferred. On the other hand, type 2 materials are alloys or chemical compounds, where ordinary conductive material is mixed in the interior thereof, so some magnetic flux 23 will partially pass therethrough. With further technical advance, such type 2 materials may become sufficient to be utilized. However, where the magnetic flux is not to be transmitted a particularly great distance, or where magnetic coupling is not essential, either type 1 or type 2 may be used. Also, for superconducting materials that are to be used in atmospheres containing moisture, or special atmospheres (acid, alkali, or organic etc. gases or splashes), or that are to be used by remaining in such atmospheres, a resin coating in accordance with the type of atmosphere (for example epoxy resin, polyfluoroethylene, polyester resin, formaldehyde resin or the like) rubber lining, or glass lining etc. must be used. The interior of the tubular superconducting magnetic flux transmission path 21 may be packed with gas, liquid, powder or solid material. The material that increases transmission efficiency of magnetic flux 23 is particularly preferred.

Consequently, with the construction of the first embodiment as above, practically all of the magnetic flux 23 generated from N pole of magnetic flux generating device 22 passes through the open part inside superconducting magnetic flux transmission path 21, or through the inside wall of magnetic flux transmission path 21, and is transmitted to one open end. From this open end, theoretically, it passes through the air and enters the other open end, returning to S pole of magnetic flux generating device 22. Consequently, in this system, the magnetic flux 23 generated from magnetic flux generating device 22 can be transmitted efficiently to an arbitrarily fixed prescribed distance, and if a device utilizing magnetic flux, for example a transformer or magnetic flux sensitive element or other device is arranged in a prescribed position, the magnetic flux 23 can be effectively utilized in transmission.

Figure 9:
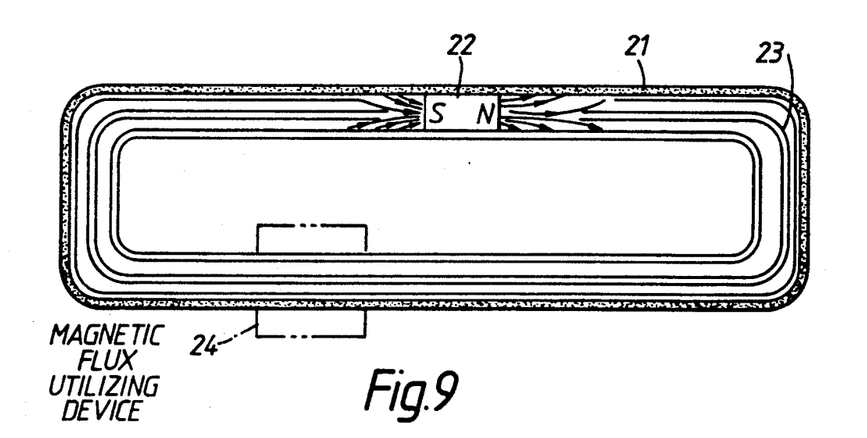
FIG. 9 is a sectional view of a magnetic flux transmission system in accordance with a second embodiment of the present invention.

It should be noted that, in FIG. 8, an ultrasonic superconducting magnetic flux transmission path 21 is used that has both its ends open. However, as shown in FIG. 9 for example, magnetic flux transmission path 21 could be used which is in the form of a closed loop. In this second embodiment, a magnetic flux utilizing device 24 may be arranged in the path of the closed loop superconducting magnetic flux transmission path 21. Whichever course is adopted, since superconducting magnetic flux transmission path 21 is in the form of a closed loop, it has the function of a feedback magnetic path.

With a configuration as in the embodiment of FIG. 9, magnetic flux utilizing device 24 can utilize the magnetic flux in close coupling, or can utilize the magnetic flux generated from magnetic flux generating device 22 reliably and effectively at a location that is quite distant.

Figure 10:
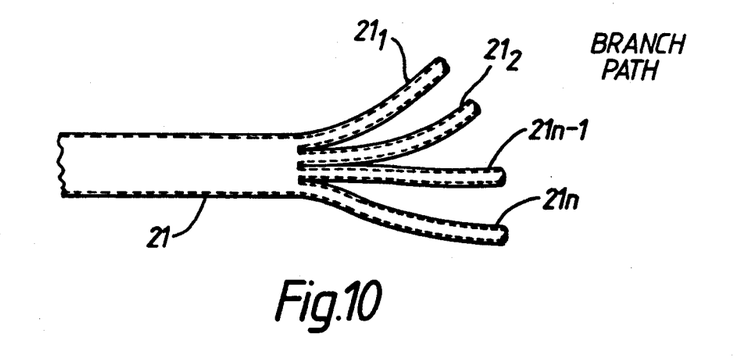
FIG. 10 is a schematic illustration of a flux transmission path in accordance with a third embodiment of the present invention.
Figure 16:
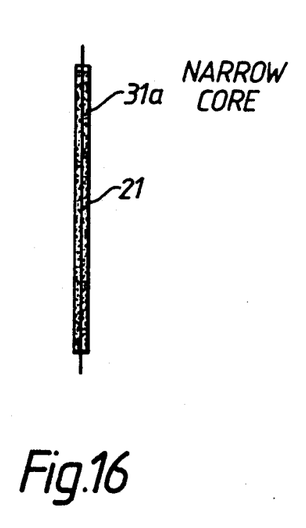
FIG. 16 is a fragmentary sectional view of a narrow core in a transmission path.
Figure 17:
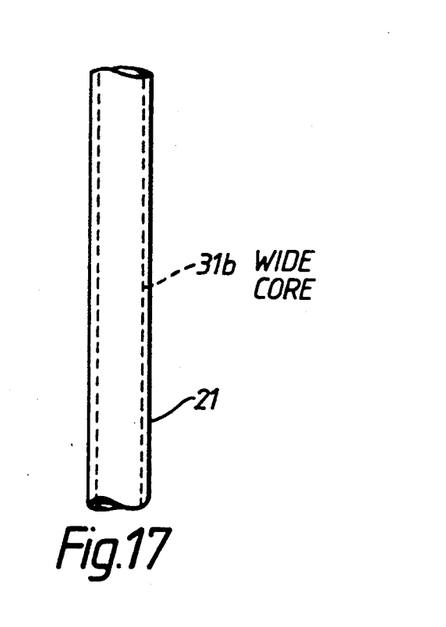
FIG. 17 is a fragmentary section view of a transmission path with a wide core.
Figure 18A:
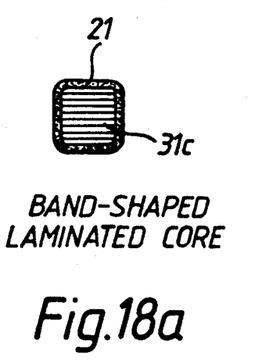
FIG. 18a is a cross sectional view schematically illustrating a band shaped core for the flux transmission system of the present invention.
Figure 18B:
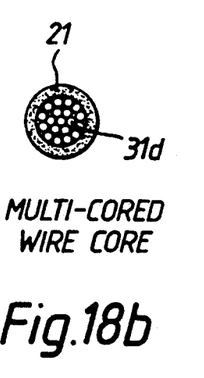
FIG. 18b is a cross sectional view schematically illustrating multiple wire core for the flux transmission path of the present invention.
Figure 18C:
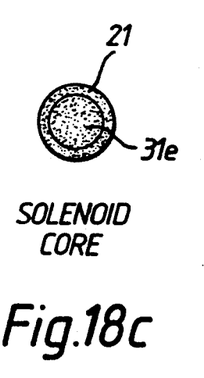
FIG. 18c is a cross sectional view illustrating a solenoid type core for the flux transmission path of the present invention.
Figure 18D:
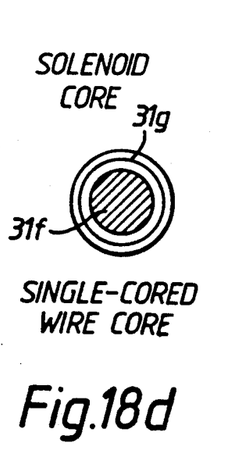
FIG. 18d is a cross sectional schematic view of a single scored wire solenoid core for the flux transmission path of the present invention.

As shown in the embodiment of FIG. 10, magnetic flux transmission path 21 could be divided into a plurality of branch paths $21_1$, $21_2$. . . at suitable locations corresponding to the locations of disposition of magnetic flux utilizing devices 24. Alternatively, in the opposite configuration, from a plurality of branch paths $21_1$, $22_2$, . . . , for example, a single magnetic flux transmission path 21, or a plurality of branch paths $21_1$, $21_2$, . . . could be directly extended. It should be noted that in this embodiment, a construction could be adopted wherein flexibility is provided, by inserting a core, as shown in FIGS. 16, 17, or 18 respectively for example, as described below, in these branch paths $21_1$, $21_2$ . . .

In particular, a plurality of branches are particularly effective when magnetic flux is fed into magnetic elements such as silicon wafer glass etc. made for example by micro machining. Also, the latter construction, where a plurality of magnetic flux transmission paths 21 are brought together, is effective for controlling the micro-machining of a silicon wafer, for example, and when two-phase or three-phase, i.e. multi-phase magnetic flux is transmitted.

Figure 11:
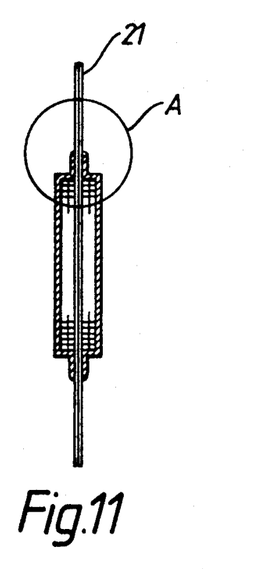
FIG. 11 schematically illustrates a magnetic flux transmission system with the flux generating device disposed outside the transmission path according to a fourth embodiment of the invention.

Also, magnetic flux generating device 22 may be provided in the interior of magnetic flux transmission path 21 as shown in the embodiments of FIG. 8 and FIG. 9. However, as shown, for example, in the embodiment of FIG. 11, magnetic flux transmission paths 21 may be arranged outside. This specific construction can be realized as shown in FIG. 12 to FIG. 15 by increasing the size of part A in FIG. 11.

Figure 12:
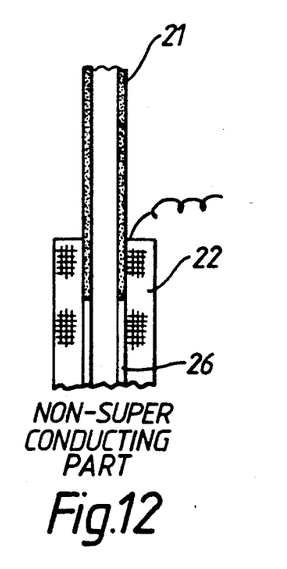
FIG. 12 is a fragmentary sectional view of the magnetic flux transmission system of FIG. 11.

FIG. 12 shows an embodiment in which the portion of magnetic flux transmission path 21 where magnetic flux generating device 22 is mounted is cut away, exposing non-superconducting part 26, i.e a part without superconducting pipe. Straddling non-superconducting part 26, for example is, the end portion of a magnetic flux generating device 22, which may be for the coil type, for example, and may be provided outside superconducting magnetic flux transmission path 21.

Figure 13:
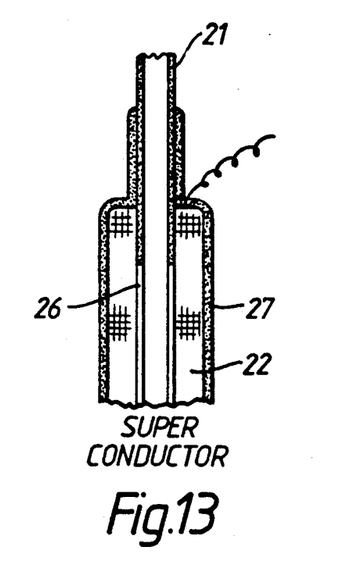
FIG. 13 is a fragmentary sectional view of a magnetic flux transmission system with the generator outside the transmission path in accordance with a fifth embodiment of the invention.

FIG. 13 is a configuration wherein magnetic flux generating device 22 is the same as in FIG. 12, except that the outside of magnetic flux generating device 22 is magnetically shielded by covering it with superconductive material 27. It should be noted that in this embodiment, an end of magnetic flux generating device 22 may be enclosed by superconductor 27.

Figure 14:
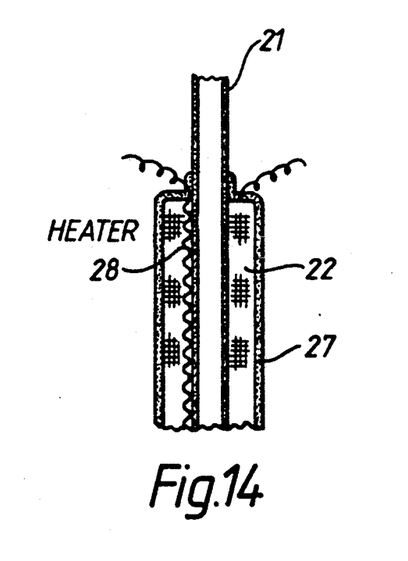
FIGS. 14 and 15 are fragmentary sectional views of the sectional views the fifth embodiment of the invention with heating elements for the transmission path.
Figure 15:
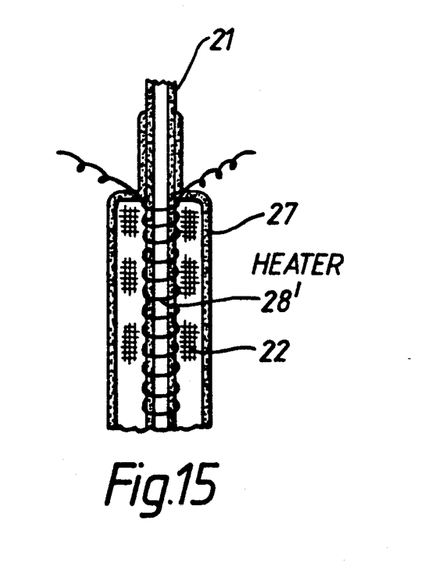

Next, in the embodiments of FIG. 14 and FIG. 15, nonsuperconducting part 26 on magnetic flux transmission path 21, such as shown in FIGS. 12 and 13 is not formed. Where magnetic flux generating device 22 surrounds magnetic flux transmission path 21, there is provided an axial heater 28 (FIG. 14) along the transmission path in a longitudinal direction between magnetic flux transmission paths 21, and magnetic flux generating device 22, or there may be provided a helical wound heater 28' (FIG. 15). This construction or configuration is such that, by applying a temperature different from the temperature conductive to the superconducting properties, heaters 28, 28' when energized, cause the loss of the superconduction function in part of magnetic flux generating device 22 where they are installed, causing the magnetic flux generated by magnetic flux generating device 22 to be fed into magnetic flux transmission path 21. It should be noted that superconductor 27 may be omitted as shown in FIG. 12, or may be provided on the outside of magnetic flux generating device 22, as shown in FIG. 13.

Consequently, with the constructions as above, magnetic flux can easily be transmitted from magnetic flux generating device 22 utilizing junction locations of non-superconducting and superconducting magnetic flux transmission path 21 as shown, for example, in FIG. 12 and FIG. 13. Moreover, there is a large contribution to the power of the magnetic flux, if magnetic flux generating devices 22 are arranged in this way at each of such junction locations. Also, in FIG. 14 and FIG. 15, magnetic flux generating device 22 may be installed without damaging the superconducting properties of magnetic flux transmission path 21, at suitable locations of magnetic flux transmission path 21. Also, supply-up of the magnetic flux can be achieved at times when it is required by controlling power to heaters 28, 28'.

Further, a core can be inserted in magnetic flux transmission path 21 as shown in, for example, FIG. 16, FIG. 17, and FIG. 18, in order to increase the efficiency of transmission of the magnetic flux generated from magnetic flux generating device 22, or as part of the function of magnetic flux generating device 22. FIG. 16 is an example, where a narrow core 31a having a diameter or cross section smaller than path 21 is inserted into magnetic flux transmission path 21. FIG. 17 is an example where a wide core 31b having a diameter or cross section as large as the inner cross section of path 21 is inserted therein. FIGS. 18a, 18b, and 18c and 18d are specific examples of the core of FIG. 17. FIG. 18a shows a band-shaped laminated core 31c. FIG. 18b shows a multiple wire core 31d. FIG. 18c shows a solenoid core 31e, such as a flexible or non-flexible core where magnetic powder is mixed with resin. FIG. 18d shows an example in which a single wire core 31f is used, with 31g as the solenoid core. In particular, it is preferable to use a flexible solenoid core etc. in locations such as the aforementioned branch parts.

Figure 19A:
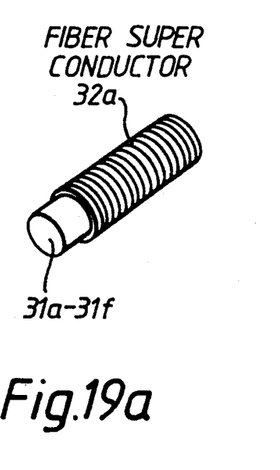
FIG. 19a schematically illustrates a transmission path where the superconductor flux transmission path is in the form of a fiber wound on a core.
Figures 19B, 19C:
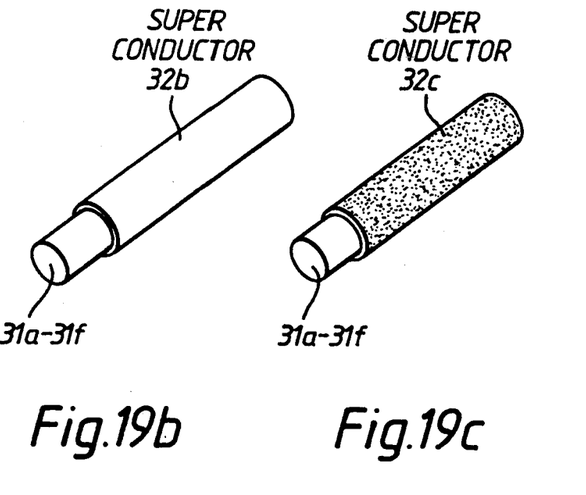
FIG. 19b is a schematic view of a flux transmission path where a superconductor is made to adhere tightly to a core, such as by drawing.
FIG. 19c is a schematic view showing a flux transmission where the superconductor is in the form of a powder bonded, sintered, or spray coated on the core.

Additionally, as shown, for example, in FIG. 19a a magnetic flux transmission path, such as 21, may be formed by winding a fibre superconductor 32a on a core of the type shown in FIG. 16, FIG. 17 or FIG. 18. Further, as shown in FIG. 19b, a method may be employed wherein a superconductor 32b is made to adhere tightly onto a core by drawing through a die. A method may be employed wherein a superconductor 32c is produced that is bonded with a binder, or where superconducting powder is sintered or spray coated onto the circumferential surface of a core, such as shown in FIG. 19c.

Figure 20:
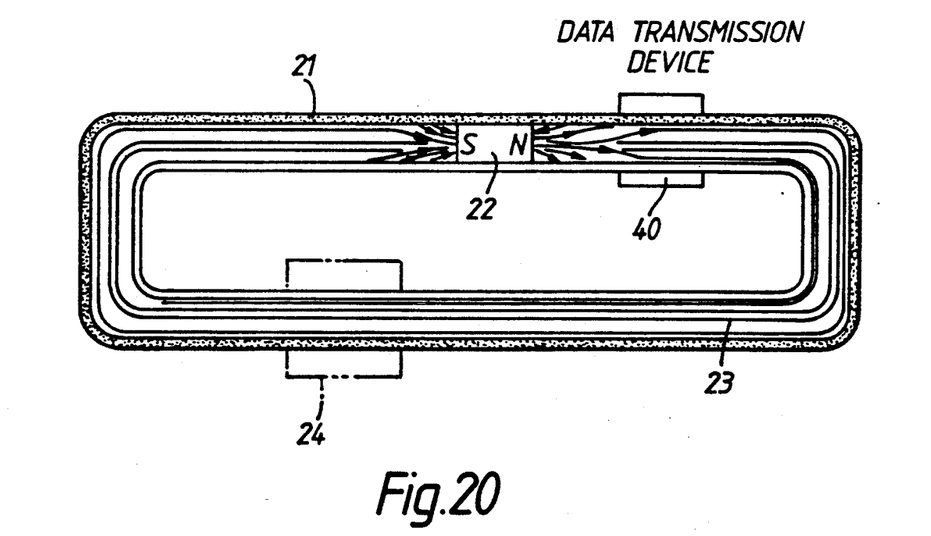
FIG. 20 schematically illustrates a flux transmission system similar to FIG. 9 provided with data transmission capabilities and FIGS. 21 and 22 each schematically illustrate a type of data transmission device for the system of FIG. 20.

A further embodiment of the system of this invention is described with reference to FIG. 20. Specifically, in this embodiment, a construction is utilized wherein a data transmission device 40 is provided that effects on/off control of magnetic flux 23 in suitable locations of magnetic flux transmission path 21 or magnetic flux generating device 22 itself. In the specific embodiment where, for example, a magnetic flux generating device 22 such as a coil is used, this data transmission device 40 may effect modulation, or turn the magnetizing power source on or off. Alternatively, symbolization of the transmission content can be performed by means that alter the on/off period, or the magnetic flux may be repetitively made to appear or disappear in magnetic flux transmission path 21 by altering the magnitude of a voltage. Data having a specific meaning can thus be transmitted by detecting this by a magnetic flux utilizing device.

Figure 21:
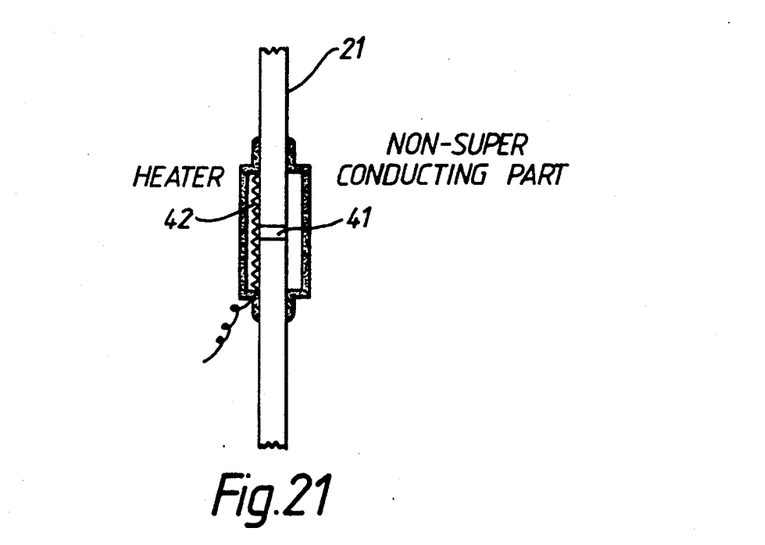

Also, as shown in FIG. 21, by removing magnetic flux transmission path 21 at suitable locations, forming nonsuperconducting parts 41, and arranging heaters 42 straddling such nonsuperconducting parts and extending to each end of magnetic flux transmission path 21, data can easily be transmitted by on/off control of the power source that passes current to such a heater 42. When the power source is on, the superconducting property of magnetic flux transmission path 21 is cancelled, fallowing magnetic flux to leak to the outside. When the power source is off, the original superconducting magnetic flux transmitting path is re-formed, allowing magnetic flux to be transmitted. Thus, information can easily be transmitted.

Figure 22:
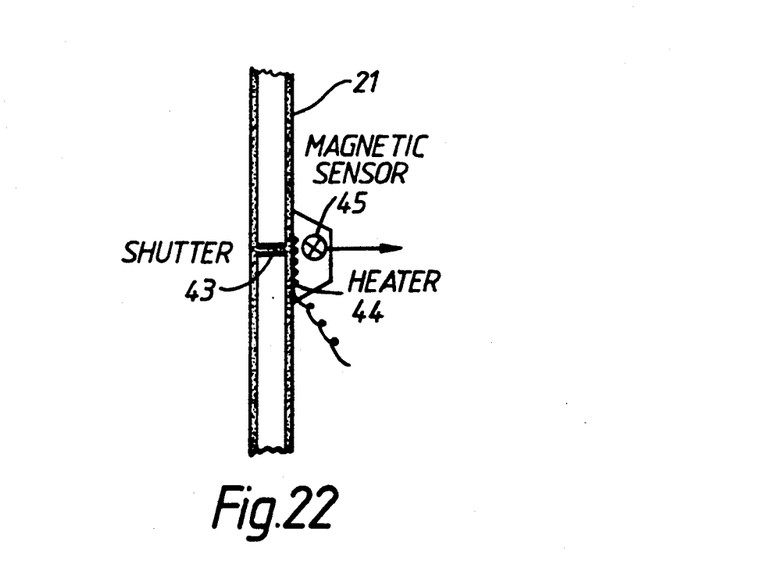

Furthermore, it is possible to transmit data by turning the magnetic flux on or off. In FIG. 22, a shutter 43 consisting of a superconductor etc. is provided, in a removable for fixed manner, in the position of non-superconducting part 41. The magnetic flux is turned on or off by inserting or withdrawing shutter 43 in nonsuperconducting portion 41 during transmission of magnetic flux. Also, by fixedly providing a shutter 43 of superconducting material etc. and by providing a heater 44 in the vicinity of this shutter, so that the power source can thereby be controlled, data can be transmitted by repeatedly causing appearance or disappearance of magnetic flux by restoration and cancellation of the function of the superconductor possessed by shutter 43 itself. In FIG. 22, a magnetic sensor is referred to at 45. The intensity of the magnetic field may be controlled by using the signal level of this magnetic sensor 45, or alternatively, to ascertain the on/off state of the magnetic flux.

Consequently, desired data can be suitably transmitted to a remote location with very little loss, since the data is transmitted utilizing magnetic flux.

It will be apparent to those skilled in the art that various modifications and variations can be made in the system of the present invention without departing from the spirit or scope of the invention. Thus, it is intended that the present invention cover the modifications and variations which come within the scope of the appended claims and their equivalents.

What is claimed is:

1. A magnetic flux transmission system comprising:
    a magnetic flux generator comprising a first geometric solid, having an external surface, an external diameter, an axis, a predetermined width, and a first predetermined axial length, for generating a magnetic field; and
    transmitting means comprising an elongated generally tubular second geometric solid, mounted to and coaxially disposed relative the magnetic flux generator, the transmitting means having at least a portion thereof made of superconducting material and having an internal surface, an internal diameter which is substantially the same as the external diameter of the magnetic flux generator, and having a second predetermined axial length substantially greater than the first predetermined axial length, defining a channel for transmitting the generated magnetic field along the channel.

2. The system of claim 1, wherein the elongated second geometric solid comprising the transmitting means is configured to form a closed loop magnetic path.

3. The system of claim 1, wherein the elongated second geometric solid comprising the transmitting means includes a plurality of individual branch portions joined at a common trunk portion.

4. The system of claim 1, further comprising:
control means for controlling the time of the transmission of flux generated by the magnetic flux generator.

5. The system of claim 1, wherein the channel defined by the tubular second geometric solid has a predetermined inner dimension and configuration, and the first geometric solid comprising the magnetic flux generator has an outer dimension and configuration corresponding substantially to the inner dimension and configuration of the, channel, the magnetic flux generator being mounted within the channel defined by the tubular second geometric solid.

6. The system of claim 1, further comprising:
a conductive core disposed coaxially in the channel defined by the tubular second geometric solid, extending along the channel in alignment with the magnetic flux generator.

7. The system of claim 1, further comprising:
a superconductive shield surrounding the magnetic flux generator.

8. The system of claim 1, further comprising:
a superconducting shutter member for blocking the generally tubular second geometric solid at a predetermined location for blocking the transmission of magnetic flux.

9. The system of claim 1, wherein the external surface of the magnetic flux generator abuts against the internal surface of the transmitting means.

10. The system of claim 6, wherein the conductive core includes a plurality of axially extending wires.

11. The system of claim 6, wherein the conductive core includes a plurality of laminated planar metallic strips.

12. The system of claim 6, wherein the conductive core includes a metallic powder.

13. The system of claim 6, wherein the conductive core includes a single axially extending wire.

14. The system of claim 6, wherein the conductive core includes a coil of wire.

15. The system of claim 6, wherein the control means includes a heating element mounted adjacent the elongated second geometric solid comprising the transmitting means.

16. A magnetic flux transmission system, comprising:
a magnetic flux generator comprising a first geometric solid, having an external surface, an external diameter, an axis and a first predetermined axial length, for generating a magnetic field; and
transmitting means comprising an elongated generally tubular second geometric solid mounted to and coaxially disposed relative the magnetic flux generator, having an internal surface, an internal diameter which is substantially the same as the external diameter of the magnetic flux generator, and having a second predetermined axial length substantially greater than the first predetermined axial length, defining a channel for transmitting the generated magnetic field along the channel; wherein
a first portion of the second predetermined axial length of the second geometric solid comprising the transmitting means extending at least beyond the flux generator includes superconducting material and a second portion of the second predetermined axial length intermediate opposite ends of the magnetic flux generator includes conductive material.

17. The system of claim 16, further comprising:
control means for interrupting the transmission of flux in the transmitting means.

18. The system of claim 17, wherein the control means for interrupting the transmission of flux in the transmitting means includes a heating element mounted adjacent the elongated second geometric solid comprising the transmitting means.

19. The system of claim 17, wherein the control means includes a superconducting shutter member for blocking the channel defined by the second geometric solid comprising the transmitting means at a predetermined location.

20. The system of claim 16, wherein the external surface of the magnetic flux generator abuts against the internal surface of the transmitting means.

21. A method of transmitting magnetic flux a substantial distance from a first to a second predetermined location, comprising:
positioning at the first predetermined location a magnetic flux generator comprising a geometric solid having an external surface, an external diameter, and opposite polarities disposed on a central axis;
coaxially mounting an elongated generally tubular member defining a channel comprised of superconducting material relative the magnetic flux generator, the elongated generally tubular member having an internal surface and an internal diameter which is substantially the same as the external diameter of the magnetic flux generator, wherein at least one end of the generally tubular member extends axially a spaced distance from the magnetic flux generator at least corresponding to the second predetermined location; and
transmitting magnetic flux from said magnetic flux generator along said channel to said second predetermined location.

22. The method of claim 21, further including mounting the elongated generally tubular member relative to the magnetic flux generator with the internal surface of the elongated generally tubular member abutting against the external surface of the magnetic flux generator.

* * * * *